United States Patent
Adachi et al.

(10) Patent No.: US 7,960,895 B2
(45) Date of Patent: Jun. 14, 2011

(54) DRIVE UNIT

(75) Inventors: Yusuke Adachi, Osaka (JP); Hideaki Mukae, Hyogo (JP); Masaru Higashionji, Osaka (JP); Eiichi Nagaoka, Hyogo (JP); Kenichi Honjo, Osaka (JP)

(73) Assignee: Panasonic Corporation, Osaka (JP)

( * ) Notice: Subject to any disclaimer, the term of this patent is extended or adjusted under 35 U.S.C. 154(b) by 231 days.

(21) Appl. No.: 12/114,861

(22) Filed: May 5, 2008

(65) Prior Publication Data

US 2008/0278032 A1    Nov. 13, 2008

(30) Foreign Application Priority Data

May 7, 2007  (JP) ................... 2007-122284

(51) Int. Cl.
    *H01L 41/08*  (2006.01)
(52) U.S. Cl. .................... 310/317; 310/323.01
(58) Field of Classification Search ............ 310/316.01, 310/316.02, 323.02; 318/116–118
    See application file for complete search history.

(56) References Cited

U.S. PATENT DOCUMENTS

| | | | | |
|---|---|---|---|---|
| 5,949,177 A | * | 9/1999 | O'Brien et al. | 310/316.01 |
| 6,064,140 A | * | 5/2000 | Zumeris | 310/323.02 |
| 6,376,965 B1 | * | 4/2002 | Kataoka et al. | 310/317 |
| 6,492,760 B1 | * | 12/2002 | Matsuda et al. | 310/323.02 |
| 6,657,361 B1 | * | 12/2003 | Morales Serrano et al. | 310/316.01 |
| 7,119,475 B2 | * | 10/2006 | Matsuzaki et al. | 310/316.01 |
| 7,211,929 B2 | * | 5/2007 | Ganor et al. | 310/317 |
| 7,352,108 B2 | * | 4/2008 | Diefenbach et al. | 310/316.02 |

FOREIGN PATENT DOCUMENTS

| | | |
|---|---|---|
| JP | 03-190577 | 8/1991 |
| JP | 03-270680 | 12/1991 |
| JP | 06-197562 | 7/1994 |
| JP | 10-234191 | 9/1998 |
| JP | 11-089255 | 3/1999 |
| JP | 2001-045773 | 2/2001 |
| JP | 2001-246324 | 9/2001 |
| JP | 2006-115583 | 4/2006 |

\* cited by examiner

*Primary Examiner* — Mark Budd
(74) *Attorney, Agent, or Firm* — Renner, Otto, Boisselle & Sklar, LLP

(57) ABSTRACT

A vibratory actuator includes a piezoelectric element, a driver element provided on the piezoelectric element and a movable body supported by the driver element. A control unit supplies a first voltage and a second voltage at the same frequency to the piezoelectric element. By supplying the first voltage and the second voltage having a difference phase from a phase of the first voltage by 90°, the piezoelectric element is lead to composite vibration of stretching and bending, thereby causing the driver to make an elliptical motion by the vibration and move the movable body. The control unit switches, during a fine mode, a phase difference between the first voltage and the second voltage between 90° and 0°.

7 Claims, 12 Drawing Sheets

DRIVE UNIT

CROSS-REFERENCE TO RELATED APPLICATION

The disclosure of Japanese Patent Application No. 2007-122284 filed on May 7, 2007 including specification, drawings and claims, is incorporated herein by reference in its entirety.

BACKGROUND OF THE INVENTION

1. Field of the Invention

The present invention relates to a drive unit.

2. Description of the Prior Art

A vibratory actuator has been conventionally known which is for use in various electronic devices or other devices and includes a piezoelectric element (electromechanical transducer) (see, for example, Patent Document 1). This piezoelectric element is obtained by alternately stacking piezoelectric bodies and electrodes. For the vibratory actuator, the piezoelectric element is vibrated by applying voltages to the electrodes, thereby moving a movable body.

Patent Document 1: Japanese Laid-Open Publication No. 2006-115583

To achieve highly accurate positioning of a movable body, the movable body may be switched from a coarse motion mode in which the movable body is moved at high speed to a fine motion mode in which the movable body is finely moved. As a driving method used in this fine motion mode, there is a so-called burst driving method.

However, in the burst driving method, vibration of a piezoelectric element is initiated and stopped at predetermined intervals (i.e., burst intervals, for example, of 100 Hz). Consequently, noise is generated.

SUMMARY OF THE INVENTION

In view of the above-described points, the present invention has been devised and it is therefore an object of the present invention to suppress noise in a drive unit when the drive unit is operated in a fine motion mode.

To solve the above-described problems, according to the present invention, a phase difference between two different phase voltages supplied to a piezoelectric element is switched between 90° and a predetermined angle θ, where $0° \leq \theta < 90°$ or $90° < \theta \leq 180°$. Specifically, a drive unit according to the present invention includes a vibratory actuator having a piezoelectric element, a driver element provided on the piezoelectric element, and a movable body supported by the driver element. In addition, the drive unit includes a control unit for supplying first and second voltages at the same frequency to the piezoelectric element, and in which the first voltage and the second voltage having a different phase from a phase of the first voltage by 90° are supplied to the piezoelectric element by the control unit to lead the piezoelectric element to composite vibration of stretching vibration and bending vibration, thereby causing the driver to make an elliptical motion by the vibration and move the movable body, and the control unit is so configured to switch, during a fine motion mode, a phase difference between the first voltage and the second voltage between 90° and a predetermined angle θ in a range from 0° or more to a smaller angle than 90°, or between 90° and a predetermined angle θ in a range from a larger angle than 90° to 180° or less.

According to the present invention, a phase difference between two different phase voltages supplied to a piezoelectric element is switched between 90° and a predetermined angle in a range from 0° or more to a smaller angle than 90° or between 90° and a predetermined angle in a range from a larger angle than 90° to 180° or less, thus allowing the piezoelectric element to vibrate continuously and suppressing the generation of noise during a fine motion mode.

BRIEF DESCRIPTION OF THE DRAWINGS

FIG. 12A is a graph obtained when a load of the movable body is light; and FIG. 12B is a graph obtained when a load of the movable body is heavy.

DESCRIPTION OF THE PREFERRED EMBODIMENTS

Embodiments of the present invention will be described hereinafter in detail with reference to the accompanying drawings.

Embodiment 1

Structure of Vibratory Actuator

Figure 1:
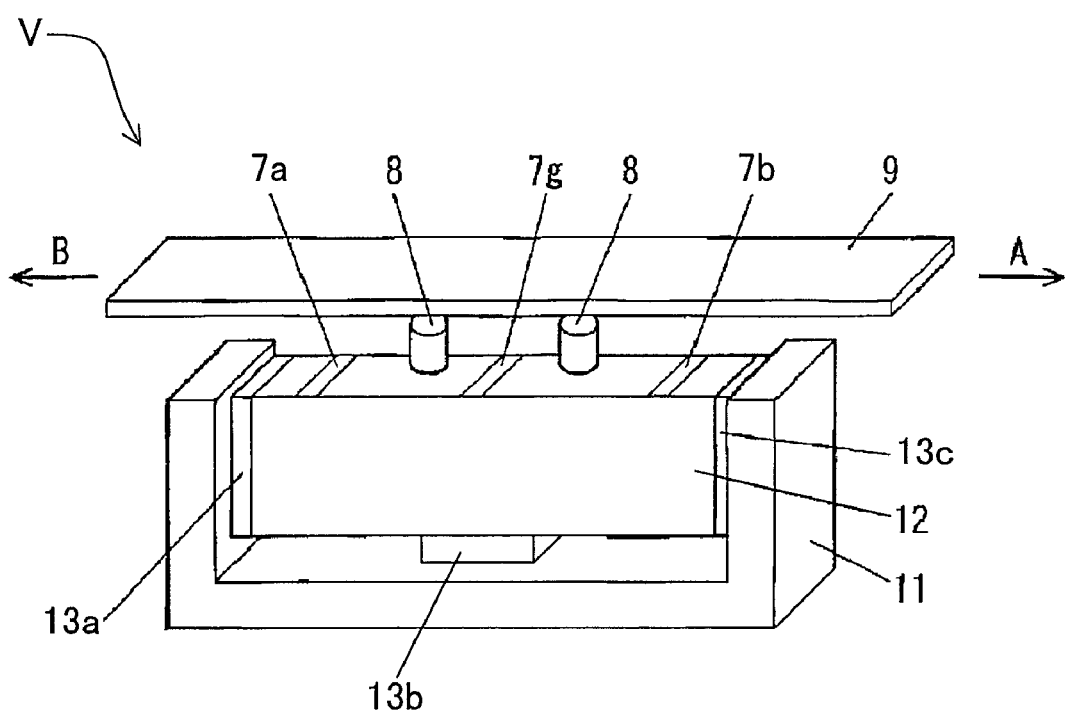
FIG. 1 is a perspective view of a vibratory actuator.
Figure 2A:
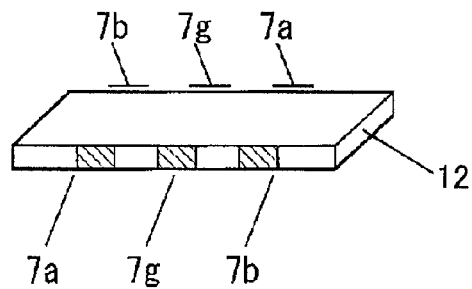
FIG. 2A is a perspective view of a piezoelectric element.
Figure 7:
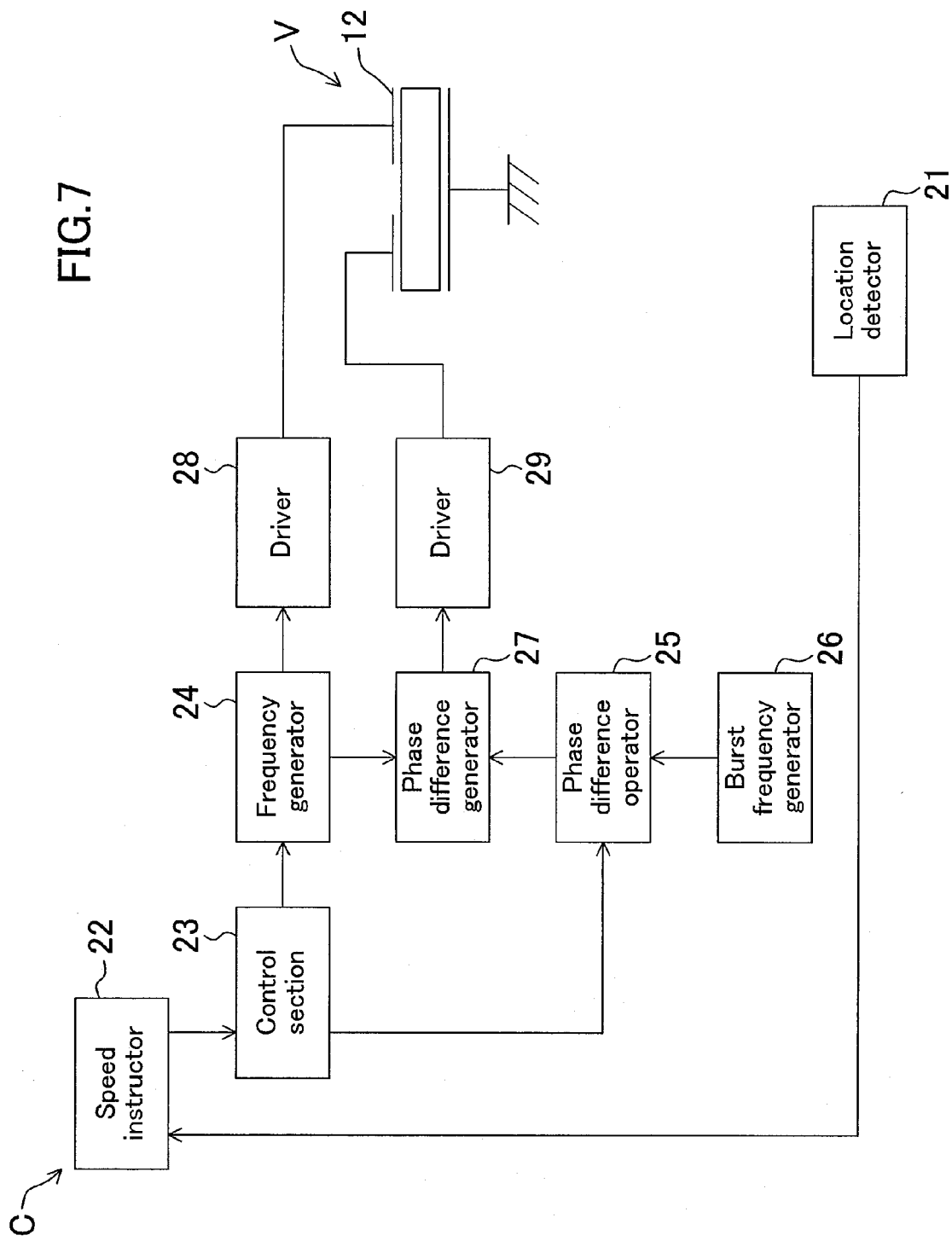
FIG. 7 is a block diagram of a control unit for the vibratory actuator.

As shown in FIG. 7, a drive unit according to the present invention includes a vibratory actuator V and a control unit C for controlling the vibratory actuator V. As shown in FIG. 1 and FIG. 2, the vibratory actuator V includes a substantially rectangular parallelepiped piezoelectric element 12 (for example, with a length of 6.0 mm×a width of 1.7 mm×a thickness of 2.4 mm). The piezoelectric element 12 has a pair of opposed principle surfaces, a pair of opposed end surfaces which are perpendicular to the principle surfaces and extend in the lengthwise direction of each principle surface of the piezoelectric element 12, and a pair of opposed side surfaces which are perpendicular to both the principle and end surfaces and extend in the widthwise direction of each principle surface thereof. The principle, end and side surfaces form the outer surfaces of the piezoelectric element 12, and the end and side surfaces form the surrounding surfaces thereof. In this embodiment, the principle surfaces each have the largest area among the principle, end and side surfaces.

The piezoelectric element 12 is contained inside a case 11 and supported by the case 11 with three supporting members 13a through 13c interposed therebetween. Driver elements 8 are disposed on one of the end surfaces of the piezoelectric element 12 so that each of the driver elements 8 is located at a portion corresponding to a loop of bending vibration wave. The driver elements 8 support a flat movable body 9. The supporter 13b, which is disposed on the other end surface of the piezoelectric element 12 (the end surface opposite to the end surface on which the driver elements 8 are disposed), presses the driver elements 8 against the movable body 9. This pressure increases the friction force between the distal ends of the driver elements 8 and the movable body 9, whereby vibration of the piezoelectric element 12 is reliably transmitted to the movable body 9 through the driver elements 8.

The piezoelectric element 12 is formed by alternately stacking substantially rectangular piezoelectric layers 1 (for example, each having a thickness of 100 μm) and internal electrode layers 2. Each piezoelectric layer 1 is an insulating layer made of a ceramic material, such as lead zirconium titanate. For example, the piezoelectric element 12 may include 24 piezoelectric layers 1 and corresponding internal electrode layers 2 (note that only 8 piezoelectric layers 1 are illustrated in FIG. 2). The internal electrode layers 2 include feeding electrode layers (positive electrode layers) 3 and common electrode layers (negative electrode layers) 4, which are alternately arranged along the stacking direction of layers (in the thickness direction of the piezoelectric element 12) with each of the piezoelectric layers 1 interposed between an associated one of the feeding electrode layers 3 and an adjacent one of the common electrode layers 4.

The feeding electrode layers 3 are first feeding electrode layers 3a, each being formed on the upper principle surface of the associated one of the piezoelectric layers 1, and second feeding electrode layers 3b, each being formed on the upper principle surface of a different one of the piezoelectric layers 1. The feeding electrode layers 3 are provided by alternatively arranging the first feeding electrode layers 3a and the second feeding electrode layers 3b in the stacking direction.

Suppose that the upper principle surface of each piezoelectric layer 1 is divided in four areas A1 through A4 (see FIG. 3), i.e., two areas in the lengthwise direction L and two areas in the widthwise direction S. Each first feeding electrode layer 3a includes four divided electrodes 3c provided in the areas A1 through A4, respectively, and a connecting electrode 3d for connecting a pair of the divided electrodes 3c formed on the diagonally opposite two areas A1 and A3 along the first diagonal direction D1 on the upper principle surface of the piezoelectric layer 1 (see FIG. 2B).

Each second feeding electrode layer 3b includes four divided electrodes 3c provided in the areas A1 through A4, respectively, and a connecting electrode 3d for connecting a pair of the divided electrodes 3c formed on the diagonally opposite two areas A2 and A4 along the second diagonal direction D2 on the upper principle surface of each piezoelectric layer 1.

The divided electrodes 3c are a substantially rectangular electrodes and overlap with the common electrode layers 4 when viewed in the stacking direction. That is, each divided electrode 3c is opposed to an associated one of the common electrode layers 4 with an associated one of the piezoelectric layers 1 interposed therebetween. Each divided electrode 3c is provided with a lead electrode 3e extending from a center portion of the divided electrode 3c in the lengthwise direction to an end surface of the piezoelectric element 12. Each lead electrode 3e does not overlap with the common electrode layers 4 when viewed in the stacking direction. That is, the lead electrode 3e is not opposed to an associated one of the common electrode layers 4. Thus, an electric field is not generated in part of each piezoelectric layer 1 opposed to the lead electrode 3e, which means that this part is piezoelectrically inactive. Each divided electrode 3c is connected to an associated one of external electrodes 7a and 7b via the lead electrode 3e. A single external electrode 7a and a single external electrode 7b are provided on each end surface of the piezoelectric element 12.

The common electrode layers 4 include common electrodes 4a. Each common electrode 4a is provided on substantially the entire upper principle surface of an associated one of the piezoelectric layers 1. On each common electrode 4a, lead electrodes 4b, each extending from a center portion of the common electrode 4a in the lengthwise direction to an associated one of end surfaces of the piezoelectric element 12, are provided. Each common electrode 4a is connected to external electrodes 7g via the lead electrodes 4b. A single external electrode 7g is provided on each end surface of the piezoelectric element 12.

Figure 2B:
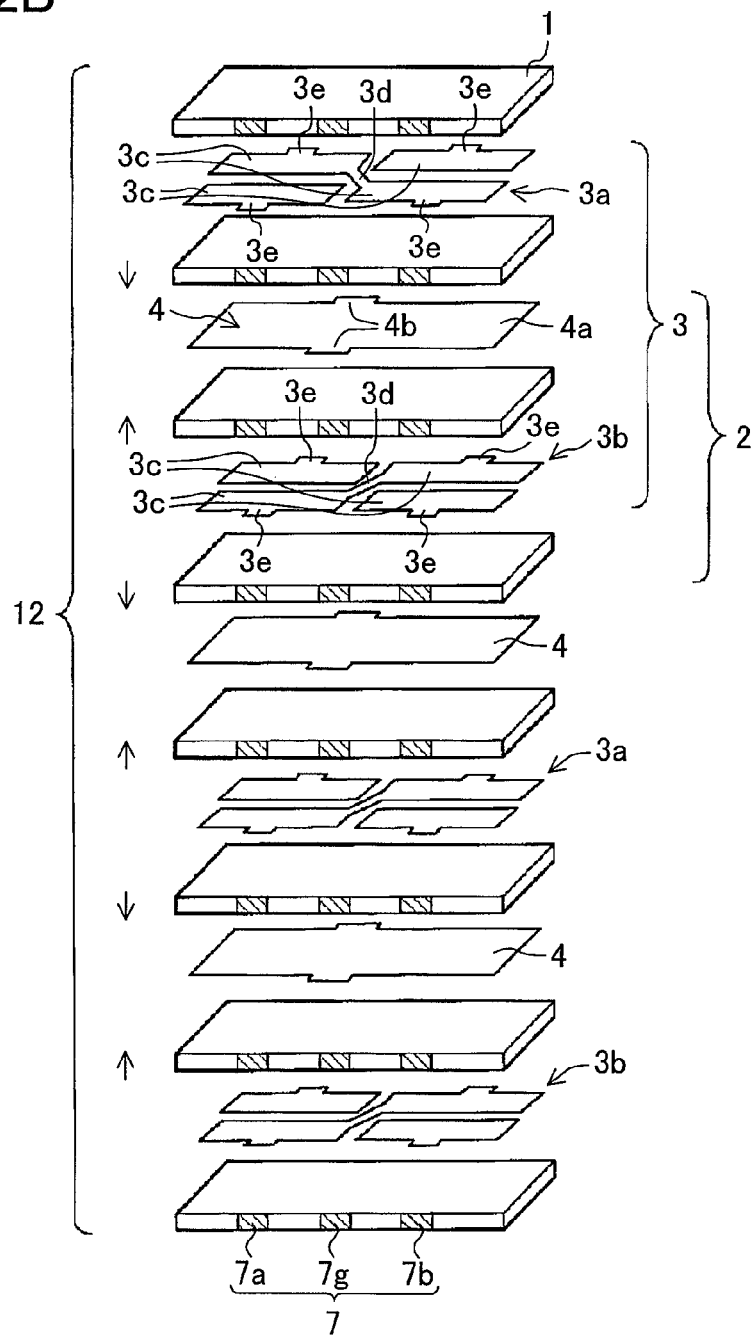
FIG. 2B is a perspective exploded view of the piezoelectric element.
Figure 3:
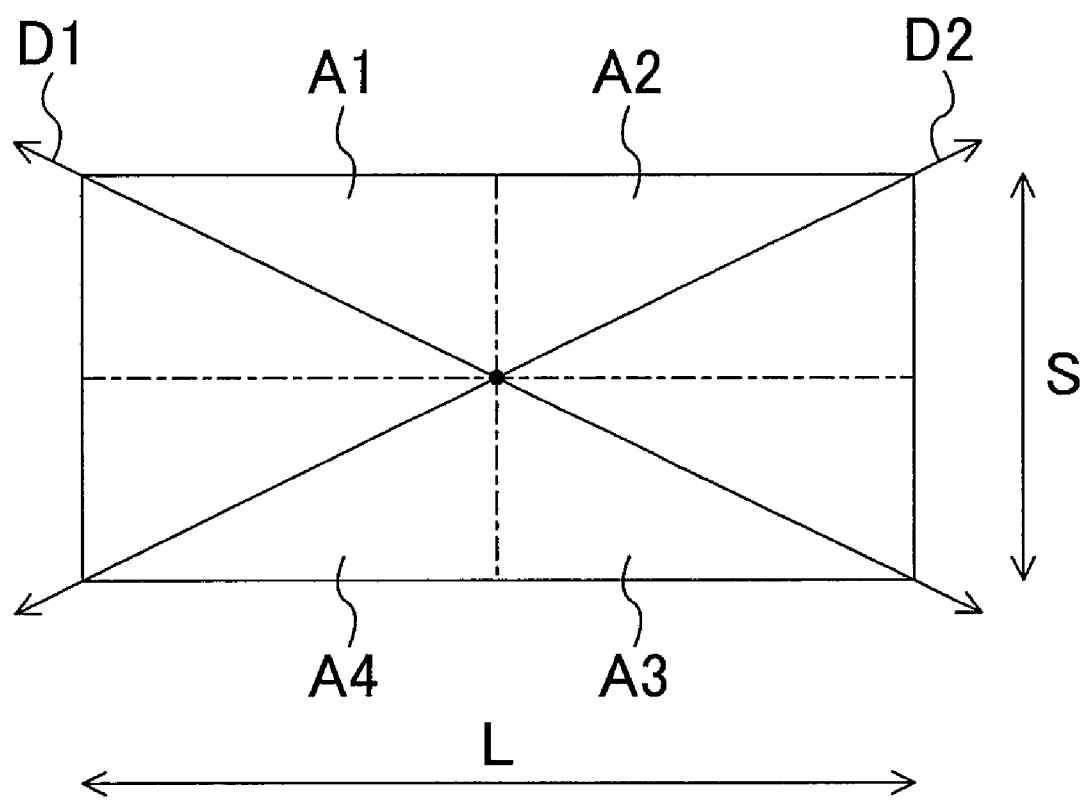
FIG. 3 is a plan view illustrating an upper principle surface of the piezoelectric element.

As indicated by arrows in FIG. 2B, each piezoelectric layer 1 is polarized from an associated one of the first feeding electrode layers 3a or the second feeding electrode layers 3b toward an associated one of the common electrode layers 4.

Resonance frequencies of stretching vibration and bending vibration of the piezoelectric element 12 are determined by the material, the shape and the like of the piezoelectric element 12. The material, the shape and the like of the piezoelectric element 12 are determined so that the resonance frequencies of stretching vibration and bending vibration substantially match each other. In this embodiment, the material, the shape and the like of the piezoelectric element 12 are determined so that the resonance frequency of the first mode of stretching vibration and the resonance frequency of the second mode of bending vibration match each other.

—The Operation of Vibratory Actuator—

Figure 4:
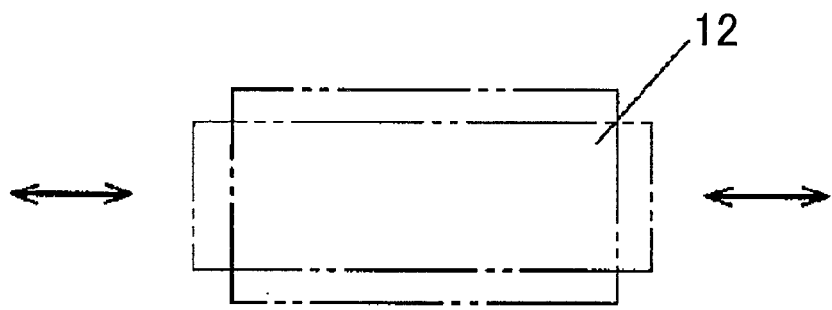
FIG. 4 is a displacement diagram of a first mode of stretching vibration.
Figure 5:
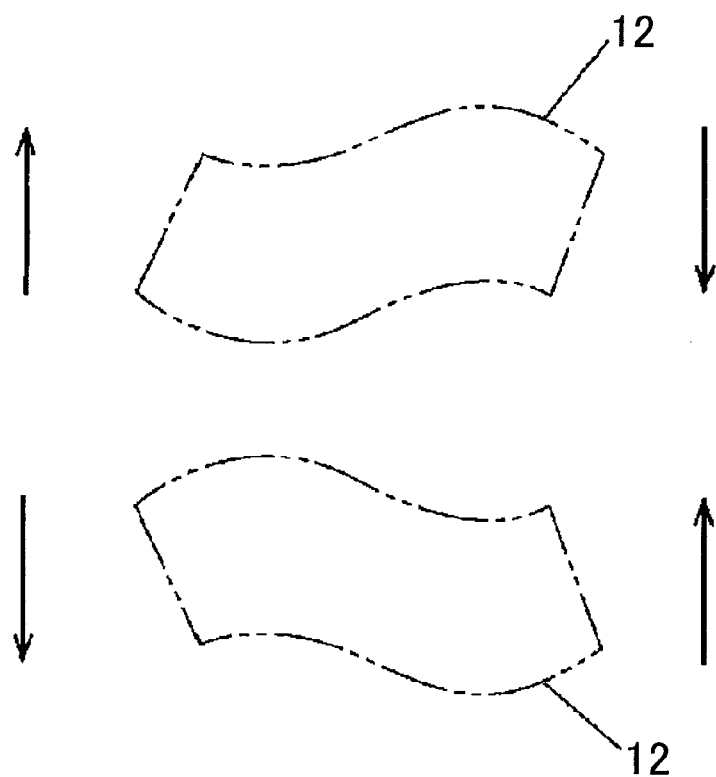
FIG. 5 is a displacement diagram of a second mode of bending vibration.
Figure 6A:
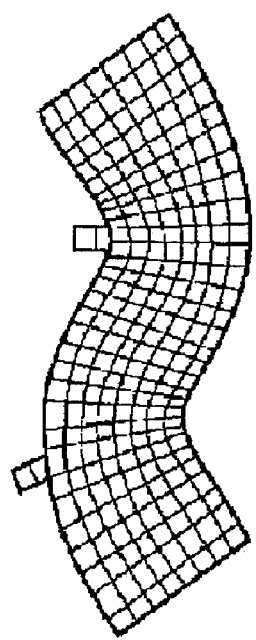
FIG. 6 is a conceptual diagram illustrating the operation of the piezoelectric element.
Figure 6B:
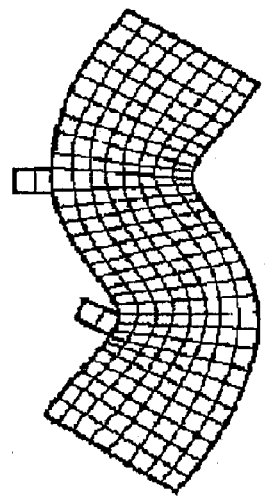
Figure 6C:
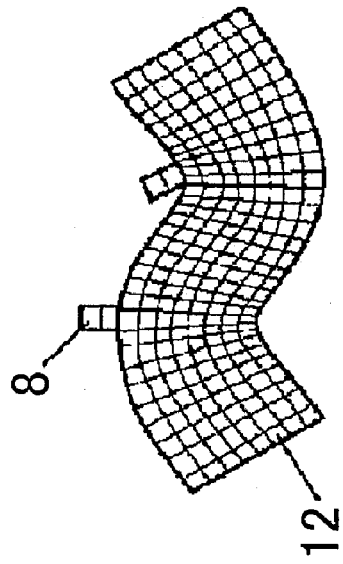
Figure 6D:
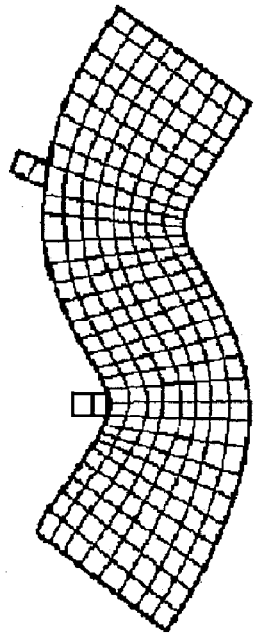

Hereafter, the operation of the vibratory actuator V will be described. FIG. 4 is a displacement diagram of the first mode of stretching vibration. FIG. 5 is a displacement diagram of the second mode of bending vibration. FIG. 6 is a conceptual diagram illustrating the operation of the piezoelectric element 12. In FIGS. 4 through 6, it is supposed that the principle surface of the piezoelectric element 12 is parallel to the page of each drawing.

A reference AC voltage (hereafter referred to as a "first voltage") which is a sine wave at a frequency around the resonance frequency is applied between each of the divided electrodes 3c provided in the areas A1 and A3 of each feeding electrode layer 3 and the common electrode 4a of an associated one of the common electrode layers 4 via a wire (not shown) and the external electrode 7. Moreover, a sine wave AC voltage (hereafter referred to as a "second voltage") which is a sine wave at substantially the same size and the same frequency as those of the first voltage is applied between each of the divided electrodes 3c provided in the areas A2 and A4 of the feeding electrode layer 3 and the common electrode 4a of the associated one of the common electrode layers 4. Accordingly, a voltage having the same phase is applied to the divided electrodes 3c in the areas A1 and A3 and also a voltage having the same phase is applied to the divided electrodes 3c in the areas A2 and A4. If a phase difference between the first voltage and the second voltage is 0°, the first mode of stretching vibration of FIG. 4 is induced in the piezoelectric element 12. If the phase difference is 180°, the second mode of bending vibration of FIG. 5 is induced in the piezoelectric element 12.

Suppose that the first voltage of a sine wave at a frequency around the resonance frequency is applied between each of the divided electrodes 3c provided in the areas A1 and A3 of the feeding electrode layer 3 and the common electrode 4a of the common electrode layer 4. Suppose further that the second voltage of a sine wave having a phase shifted by 90° or −90° relative to the first voltage and having substantially the same size and the same frequency is applied between each of the divided electrodes 3c provided in the areas A2 and A4 of the feeding electrode layer 3 and the common electrode 4a of the common electrode layer 4. This induces the first mode of stretching vibration of FIG. 4 and the second mode of bending vibration of FIG. 5 in harmony in the piezoelectric element 12.

Then, the shape of the piezoelectric element 12 varies in the order shown in FIGS. 6A through 6D. As a result, the driver elements 8 provided in the piezoelectric element 12 make an elliptical motion when viewed in the direction normal to the page in FIGS. 6A through 6D. That is, the elliptical motion of the driver elements 8 is made by composite vibration of stretching vibration and bending vibration of the piezoelectric element 12. This elliptical motion causes a relative motion of the movable body 9 supported by the driver elements 8 with the piezoelectric element 12, whereby the movable body 9 moves in the directions shown by arrows A and B of FIG. 1.

In this case, the stretching direction of stretching vibration is along the lengthwise direction of the principle surfaces of the piezoelectric element 12, i.e., the movement direction of the movable body 9. The vibration direction of bending vibration is along the direction in which the driver elements 8 support the movable body 9. The stacking direction of the piezoelectric element 12 is perpendicular to each of the stretching direction of stretching vibration and the vibration direction of bending vibration.

—Control of Vibratory Actuator—

Hereafter, how the vibratory actuator V is controlled will be described. FIG. 7 is a block diagram of a control unit C for the vibratory actuator V. Based on location information from a location detector 21 for detecting the location of the movable body 9, a speed instructor 22 determines the movement speed of the movable body 9 and sends the speed information to a control section 23. The control section 23 determines, based on the speed information from the speed instructor 22, frequencies of the first and second voltages and a phase difference between the first voltage and the second voltage. The control section 23 sends the frequency information to a frequency generator 24 and the phase difference information to a phase difference operator 25. The phase difference operator 25 determines, based on the phase difference information from the control section 23 and burst information from a burst frequency generator 26, a phase difference according to the mode (e.g., normal made of fine motion mode) and sends the phase difference information to a phase difference generator 27. A sine wave voltage at a predetermined frequency, which is generated from the frequency generator 24, is applied as the first voltage to the piezoelectric element 12 via a driver 28. The voltage generated from the frequency generator 24 is phase-shifted by the phase difference generator 27 and is applied, as the second voltage having the same frequency as the frequency of the first voltage and a different phase relative to the first voltage, to the piezoelectric element 12 via a driver 29.

Figure 8:
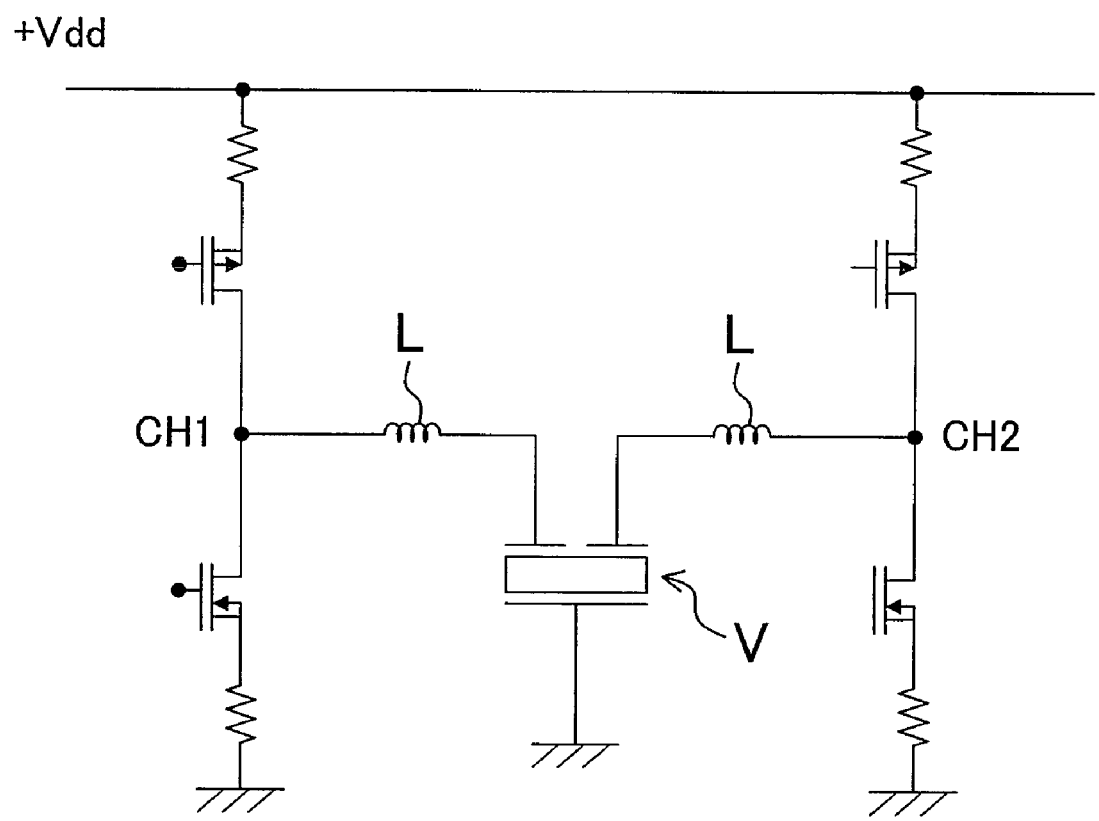
FIG. 8 is a circuit diagram illustrating a configuration for drivers.

FIG. 8 is a circuit diagram illustrating a configuration for the drivers 28 and 29. With the configuration including two half bridges, a rectangular wave between a supply voltage Vdd (for example, 5 V) and 0 V is applied to CH1 and CH2 of FIG. 8. The vibratory actuator (capacitor) V and inductors L each being connected to the vibratory actuator V together form a low pass filter. The low pass filter removes high frequency components of the rectangular wave, thereby achieving a sine wave between a voltage around the supply voltage and a 0 V peak to peak.

Figure 9:
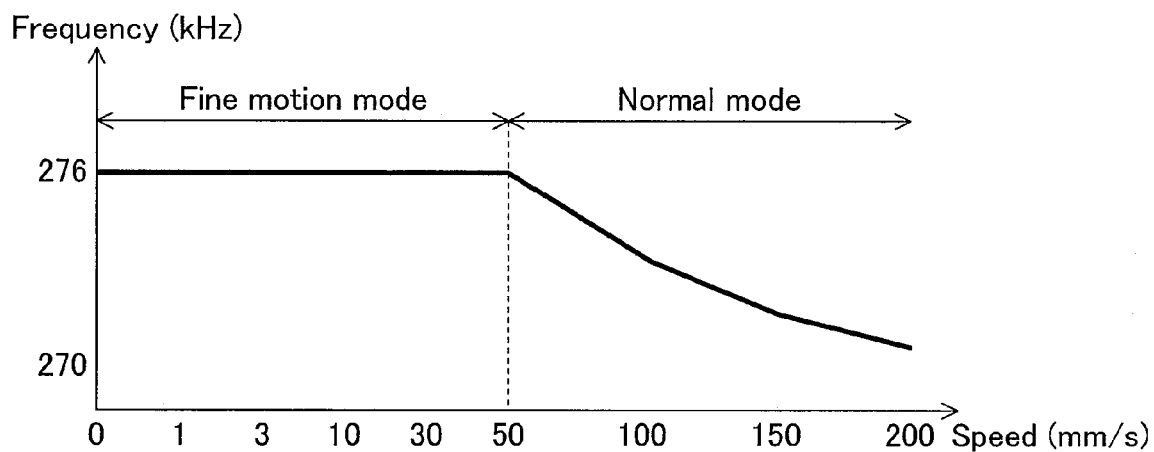
FIG. 9 is a graph illustrating a normal mode and a fine motion mode.

FIG. 9 is a graph illustrating a normal mode and a fine motion mode. During a normal mode in which a desired movement speed of the movable body 9 is a predetermined speed (for example, 50 mm/s) or more, the frequency generator 24 generates a higher drive frequency than the resonance frequency of the piezoelectric element 12 (for example, 270 kHz). When it is desired to increase the movement speed of the movable body 9, the drive frequency is set to be low. On the other hand, when it is desired to reduce the movement speed of the movable body 9, the drive frequency is set to be high. That is, the higher the movement speed of the movable body 9 is, the lower the drive frequency is set to be.

As has been described, during the normal mode, the drive frequency is controlled according to the movement speed of the movable body 9, while the first and second voltages are supplied continuously.

Figure 10:
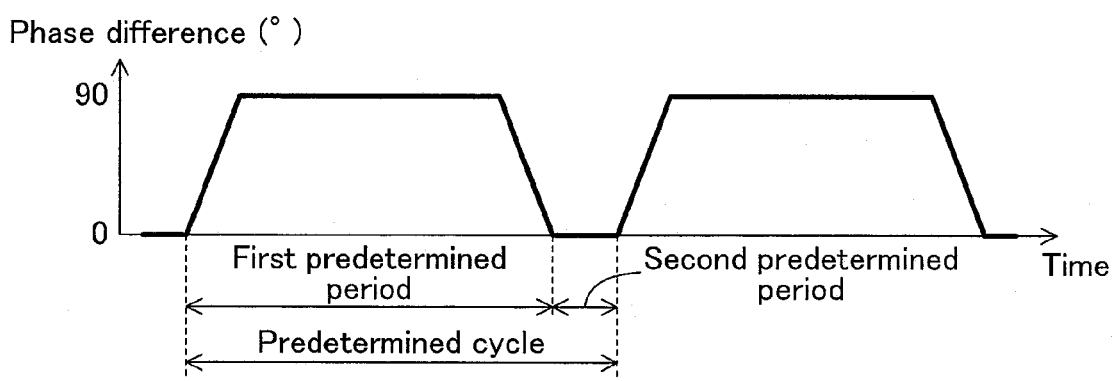
FIG. 10 is a graph illustrating changes in phase difference.

On the other hand, during the fine motion mode (or intermittent operation in which the movable body 9 is slowly moved) in which a desired movement speed of the movable body 9 is lower than the predetermined speed, the frequency generator 24 generates a fixed drive frequency (which is the same frequency as the highest frequency of the normal mode, i.e., for example, 276 kHz) slightly higher than the resonance frequency. The burst frequency generator 26 preferably generates, as a predetermined cycle (burst cycle) as shown in FIG. 10, a frequency of one fifth or less of the drive frequency, such as 10 Hz to 100 kHz, and more preferably a frequency of 10 Hz to 200 Hz or 20 kHz to 100 kHz (which exceeds the audio frequency range). In this embodiment, the predetermined cycle is set to be 100 Hz (10 ms). The phase difference between the first voltage and the second voltage is switched between 90° and 0° (which are predetermined angles) at predetermined intervals. Specifically, after the phase difference is smoothly changed from 0° to 90° in proportion to time, the phase difference is maintained to be 90°. Then, after the phase difference is smoothly changed from 90° to 0° in proportion to time, the phase difference is maintained to be 0°. That is, in one predetermined cycle, the phase difference is trapezoidally changed between 0° and 90° and then is maintained to be 0°. A time required for changing the phase difference from 0° to 90° is about 1 ms.

Then, suppose that in the predetermined cycle, a period in which the phase difference is trapezoidally changed between 0° and 90° is a first predetermined period (burst ON period) and a period in which the phase difference is maintained to be 0° is a second predetermined period (burst OFF period). When it is desired to increase the movement speed of the movable body 9, the first predetermined period is increased and the second predetermined period is reduced. On the other hand, when it is desired to reduce the movement speed of the movable body 9, the first predetermined period is reduced and the second predetermined period is increased. That is, the higher the movement speed of the movable body 9 is, the shorter the second predetermined period is set to be.

As has been described, during the fine motion mode, the phase difference between the first voltage and the second voltage is controlled, while the first and second voltages are continuously supplied.

Figure 11:
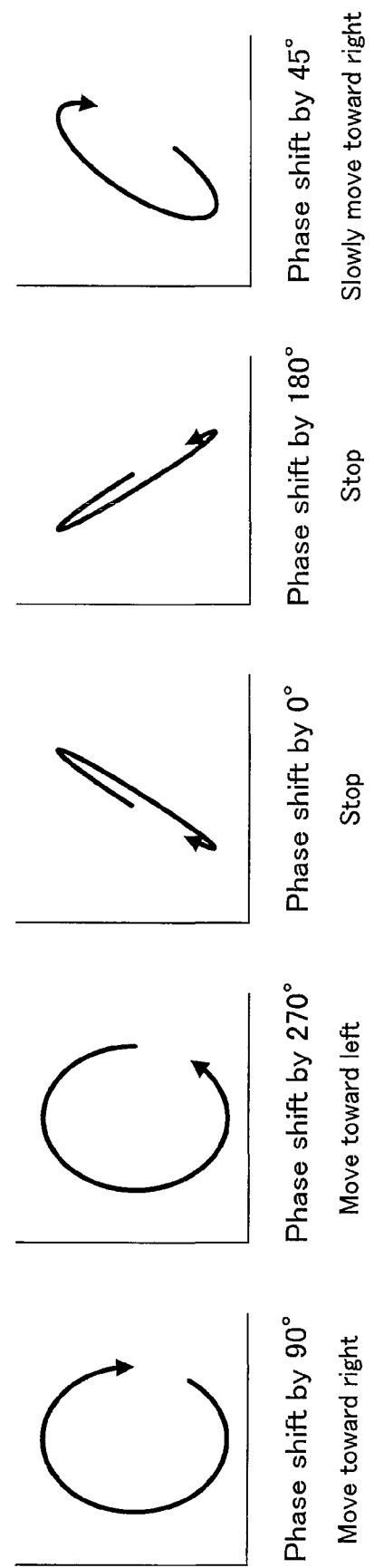
FIG. 11 is an illustration showing trajectory for movements of drivers.

Trajectories generated for movements of the driver elements 8 are shown in FIG. 11. When the phase of the second voltage is shifted by 90° relative to the first voltage, the driver elements 8 make a clockwise elliptical motion such that the major axis or the minor axis of the elliptical motion of each driver element 8 extend substantially along the movement direction of the movable body 9. In this embodiment, the movable body 9 moves in the direction shown by the arrow A of FIG. 1 (toward the right). When the phase is shifted by 270° (the phase difference between the first voltage and the second voltage is 90°), the driver elements 8 make an anticlockwise elliptical motion, whereby the movable body 9 moves in the direction shown by the arrow B of FIG. 1 (toward the left). When the phase difference is 0° or 180°, the driver elements 8 make a diagonal straight line motion and the movable body 9 does not move. Using those movements, the driver elements 8 are made to intermittently make an elliptical motion, whereby the movable body 9 is finely moved. Note that when the phase is shifted by 45°, the driver elements 8 make an elliptical motion such that the major axis or the minor axis of the elliptical motion of the driver element 8 are shifted from the movement direction of the movable body 9. In such a case, the movable body 9 slowly moves in the direction shown by the arrow A, compared to the case where the phase is shifted by 90°. When the phase is shifted by 135°, 225° or 315° (or the phase difference between the first voltage and the second voltage is 45° of 135°), similar trajectory to this is achieved.

As has been described, according to this embodiment, the piezoelectric element 12 moves continuously, so that burst noise which occurs when the piezoelectric element 12 starts moving is reduced, compared to normal burst driving. Moreover, by gradually changing the phase difference between the first voltage and the second voltage, burst noise is further reduced and, in addition, abnormal vibration of the piezoelectric element 12 due to drastic change in phase can be suppressed. This results in high reliability. Furthermore, by setting the driving frequency to be a relatively high frequency, i.e., the same frequency as the highest frequency of the normal mode, the amplitude of the piezoelectric element 12 is suppressed and thus the burst noise is further reduced.

Figure 12A:
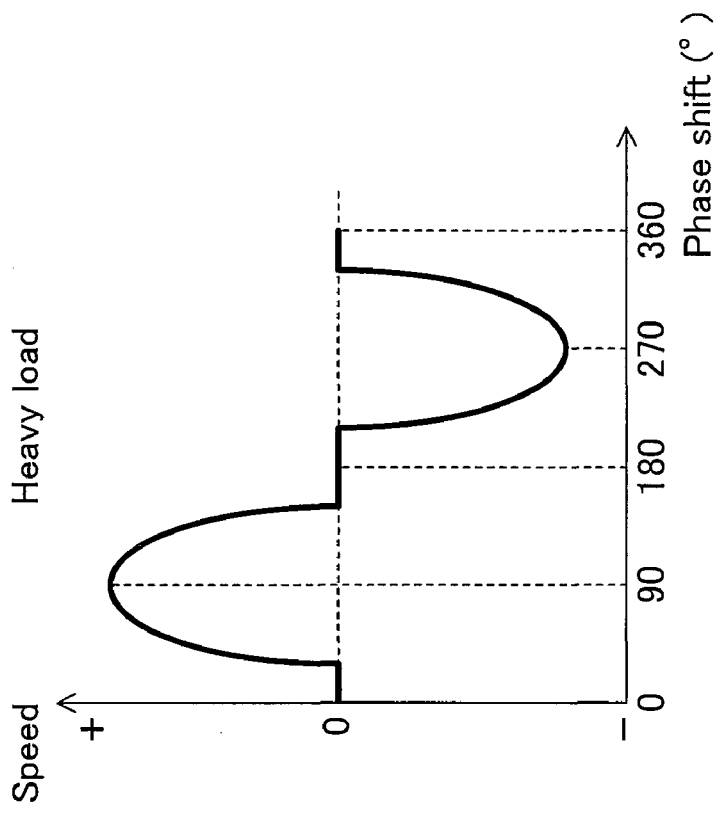
FIGS. 12A and 12B are graphs showing the relationship between the phase shift and the movement speed of a movable body.
Figure 12B:
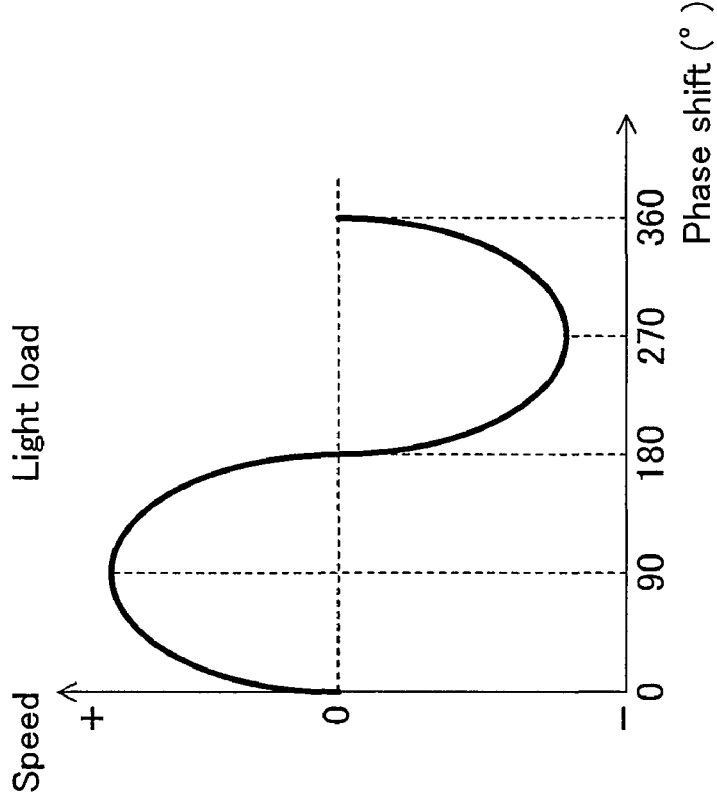

The relationship between the phase difference and the movement speed of the movable body 9 is shown in FIGS. 12A and 12B. When the load (weight) of the movable body 9 is light, as shown in FIG. 12A, the movement speed of the movable body 9 is continuously changed as the phase shift varies. When the load (weight) of the movable body 9 is heavy, as shown in FIG. 12B, a dead zone is generated around 0° and 180°. By changing the phase difference during phase difference burst driving not in the range from 90° to 0° but in the range from 90° to a predetermined angle that is larger than 0°, the change of the piezoelectric element 12 is small and thus an impact to the piezoelectric element 12 is also small. This results in high reliability. Moreover, the burst noise can be reduced according to reduction in the impact. Furthermore, the trajectory for the movement of the driver elements 8 during the second predetermined period is not linear but slightly elliptical, so that an area in which the driver elements 8 are brought into contact with the movable body 9 is increased and the durability of the movable body 9 is improved.

Figure 13:
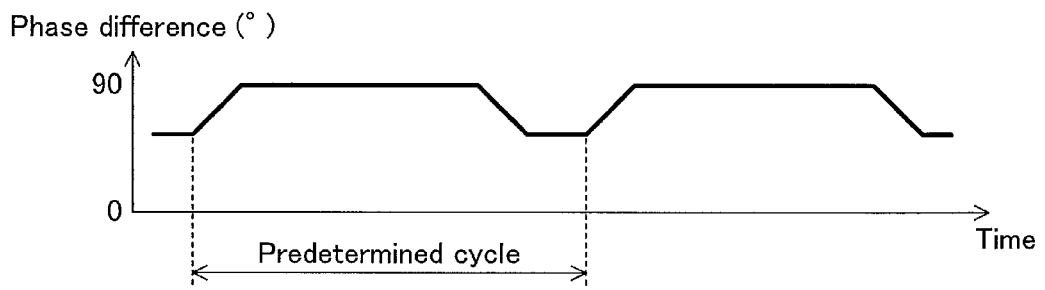
FIG. 13 is a graph showing changes in phase difference.

In this embodiment, during the fine motion mode, the phase difference between the first voltage and the second voltage is switched between 90° and 0° at predetermined intervals. However, as shown in FIG. 13, the phase difference may be changed between 90° and a predetermined angle θ in a range from 0° or more to a smaller angle than 90° (i.e., 0≦θ<90°), or between 90° and a predetermined angle θ in a range from larger than 90° to an angle equal to or smaller than 180° (i.e., 90°<θ≦180°). If the phase difference is changed between 90° and 180°, the same action and effects as those of this embodiment can be achieved. If the phase difference is changed between 90° and 45° or 135°, as has been described, the driver elements 8 make an elliptical motion such that the major axis and the minor axis are shifted from the movement direction of the movable body 9, thus resulting in increase in lifetime of the movable body 9.

Figure 14:
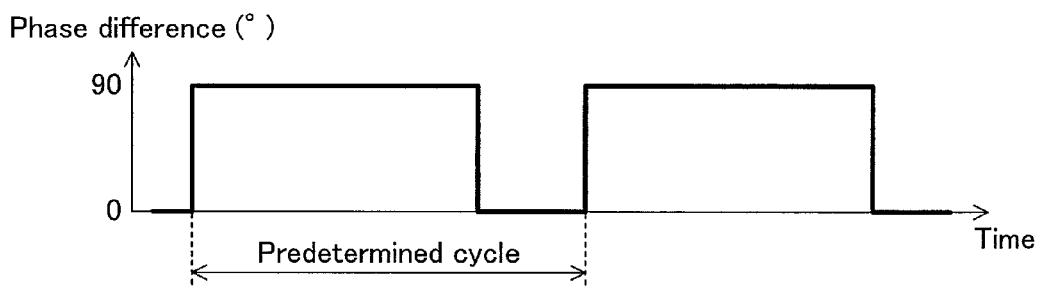
FIG. 14 is a graph showing changes in phase difference.
Figure 15:
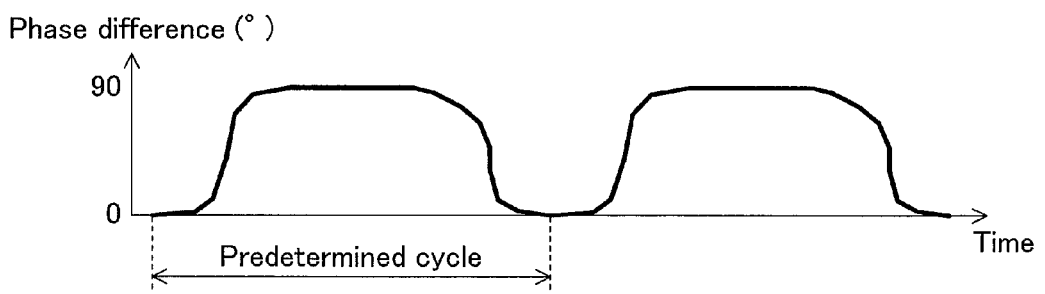
FIG. 15 is a graph showing changes in phase difference.

In this embodiment, the phase difference is changed from 0° to 90° and from 90° to 0° in proportion to time. However, the manner of changing the phase difference is not limited thereto. For example, as shown in FIG. 14, the phase difference may be drastically changed from 0° to 90° and 90° to 0°. Also, as shown in FIG. 15, the phase difference may be changed from 0° to 90° and 90° to 0° in a stepwise manner.

Figure 16:
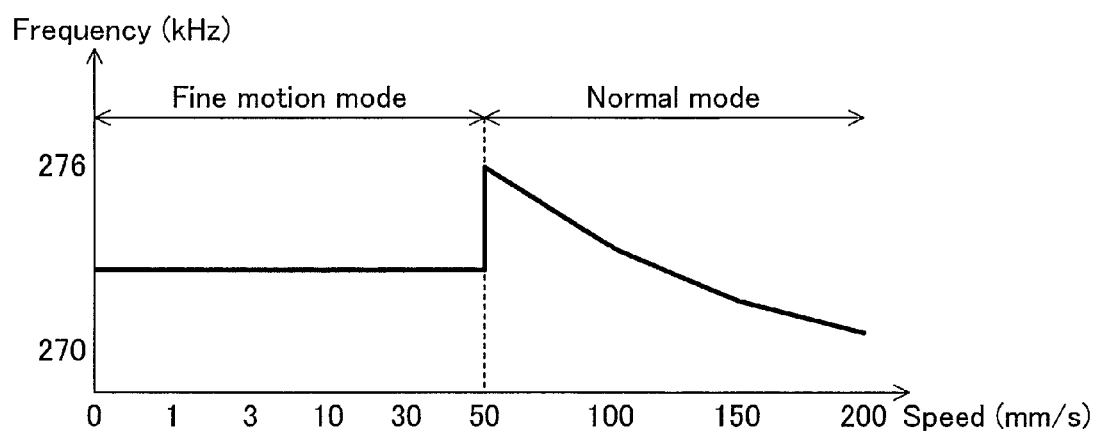
FIG. 16 is a graph illustrating the normal mode and the fine motion mode.

In this embodiment, during the fine motion mode, the fixed driving frequency of the first and second voltages is set to be the same frequency as the highest frequency in the normal mode. However, as shown in FIG. 16, the fixed driving frequency of the first and second voltages may be set to be lower than the highest frequency in the normal mode. In that case, an increased efficiency can be achieved.

Other Embodiments

The structure of the piezoelectric element 12 is not limited to the structure described in the above-described embodiment. For example, instead of the common electrode layers 4, electrode layers each including four divided electrodes as the feeding electrode layers 3 may be provided.

In the above-described embodiment, the divided electrode 3c is a substantially rectangular electrode. The shape of the divided electrode 3c is not limited thereto but, for example, the divided electrode 3c may have a shape corresponding to the distribution of stresses caused by vibration.

In the above-described embodiment, a power supply method using wires has been described. However, some other power supply method such as a method for supplying power using conductive rubber, a flexible substrate, contact pins or the like may be used. Even using such a power supply method, the same effects as those of the above-described embodiment can be achieved.

Figure 17:
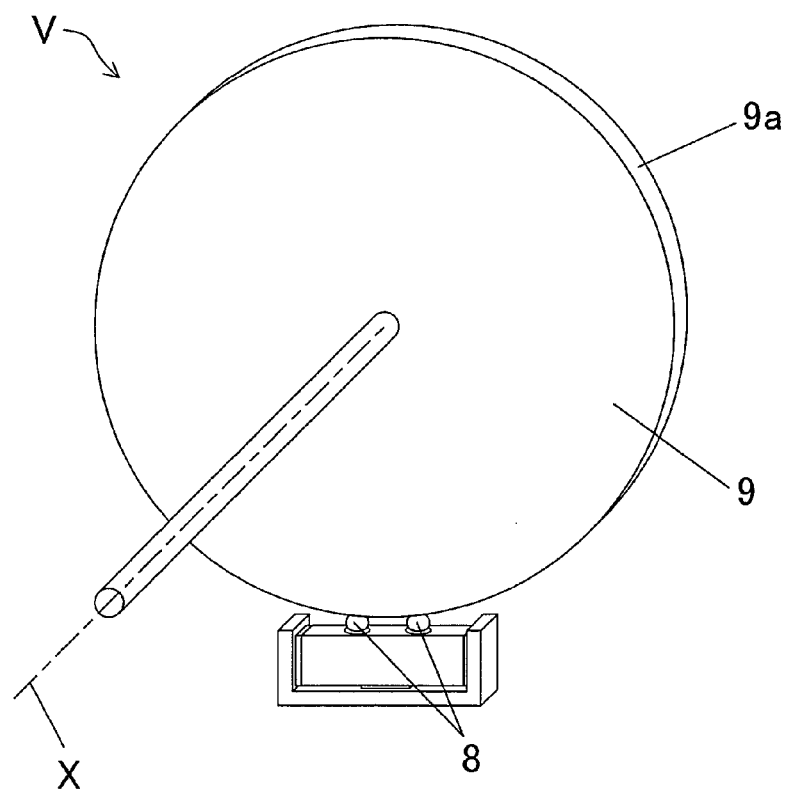
FIG. 17 is a perspective view of a modified example of the vibratory actuator.

In the above-described embodiment, the movable body 9 which is driven by application of a driving force of the vibratory actuator V has a flat shape. However, the shape of the movable body 9 is not limited thereto. An arbitrary configuration of the movable body 9 may be adopted. For example, as shown in FIG. 17, the movable body 9 may be configured to have a circular disc-shaped object capable of rotating around a predetermined axis X such that the driver elements 8 of the vibratory actuator V are brought in contact with a side peripheral surface 9a of the disc-shaped object 9. With this structure, when the vibratory actuator V is driven, the disc-shaped object 9 is rotated around the predetermined axis X by the elliptical motion of the driver elements 8.

In this embodiment, the configuration in which the driver elements 8 are provided only in one end surface of the piezoelectric element 12 has been described. However, the driver elements 8 may be formed on one side surface of the piezoelectric element 12. In that case, the stretching direction of the first mode of stretching vibration is along the direction in which the driver elements 8 support the movable body 9 and the vibration direction of the second mode of bending vibration is along the movement direction of the movable body 9.

The present invention is not limited to the above-described embodiments and may be embodied in various other forms without departing from the spirit or essential character thereof.

Thus, the above-described embodiments are merely examples in all respects and must not be construed to limit the invention. The scope of the present invention is defined by the scope of the claims of the present invention and is not limited at all by the specific description of this specification. Furthermore, all the modifications and changes belonging to equivalents of the claims are considered to fall within the scope of the present invention.

As has been described above, a drive unit according to the present invention is applicable to a technique for suppressing noise in a fine motion mode and the like.

What is claimed is:

1. A drive unit which includes: a vibratory actuator having a piezoelectric element, a driver element provided on the piezoelectric element, a movable body supported by the driver element; and a control unit for supplying first and second voltages at the same frequency to the piezoelectric element, and
in which the first voltage and the second voltage having a different phase from a phase of the first voltage by 90° are supplied to the piezoelectric element by the control unit to lead the piezoelectric element to composite vibration of stretching vibration and bending vibration, thereby causing the driver element to make an elliptical motion by the vibration and move the movable body,
wherein during a normal mode, a desired movement speed of the movable body is a predetermined speed or more, and
during a fine motion mode, the desired movement speed of the movable body is lower than the predetermined speed and the control unit periodically switches the first and second voltages during the fine motion mode between a first state where the first voltage and the second voltage whose phases differ by 90° are supplied and a second state where the first voltage and the second voltage whose phases differ by a predetermined angle θ, where $0° \leq θ < 90°$ or $90° < θ \leq 180°$, are supplied.

2. The drive unit of claim 1, wherein the control unit switches, during the fine motion mode, between the first state and the second state so that a phase difference between the first voltage and the second voltage gradually varies between 90° and the predetermined angle.

3. The drive unit of claim 1, wherein the predetermined angle is 0° or 180°.

4. The drive unit of claim 1, wherein the predetermined angle is 45° or 135°.

5. The drive unit of claim 1, wherein the control unit shortens, during the fine motion mode, a period in which the phase difference between the first voltage and the second voltage is maintained to be the predetermined angle as a desired movement speed of the movable body is increased.

6. The drive unit of claim 1, wherein the control unit is configured to lower, during the normal mode, the frequency of the first and second voltages as a desired movement speed of the movable body is increased and set, during the fine motion mode, the frequency of the first and second voltages to be the same frequency as a highest frequency in the normal mode.

7. The drive unit of claim 1, wherein the control unit is configured to lower, during the normal mode, the frequency of the first and second voltages as a desired movement speed of the movable body is increased and set, during the fine motion mode, the frequency of the first and second voltages to be lower than a highest frequency in the normal mode.

* * * * *